(12) United States Patent
Chen et al.

(10) Patent No.: US 12,451,396 B2
(45) Date of Patent: Oct. 21, 2025

(54) SEMICONDUCTOR PACKAGE AND METHOD OF FORMING SAME

(71) Applicant: Taiwan Semiconductor Manufacturing Co., Ltd., Hsinchu (TW)

(72) Inventors: Chen-Shien Chen, Zhubei (TW); Ting-Hao Kuo, Hsinchu (TW); Hsu-Hsien Chen, Hsinchu (TW); Yu-chih Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 564 days.

(21) Appl. No.: 17/743,999

(22) Filed: May 13, 2022

(65) Prior Publication Data

US 2023/0040030 A1    Feb. 9, 2023

Related U.S. Application Data

(60) Provisional application No. 63/230,103, filed on Aug. 6, 2021.

(51) Int. Cl.
*H01L 21/66* (2006.01)
*H01L 21/683* (2006.01)
(Continued)

(52) U.S. Cl.
CPC .......... *H01L 22/20* (2013.01); *H01L 21/6835* (2013.01); *H01L 22/34* (2013.01); *H01L 24/03* (2013.01); *H01L 24/11* (2013.01); *H01L 24/96* (2013.01); *H01L 25/105* (2013.01); *H01L 25/50* (2013.01); *H01L 23/481* (2013.01); *H01L 24/05* (2013.01); *H01L 24/06* (2013.01); *H01L 24/13* (2013.01); *H01L 2221/68327* (2013.01); *H01L 2224/03452* (2013.01); *H01L 2224/037* (2013.01); *H01L 2224/0401* (2013.01); *H01L 2224/0557* (2013.01); *H01L 2224/05647* (2013.01); *H01L 2224/05686* (2013.01); *H01L 2224/06181* (2013.01);
(Continued)

(58) Field of Classification Search
CPC ...... H01L 21/6835; H01L 22/20; H01L 24/96
See application file for complete search history.

(56) References Cited

U.S. PATENT DOCUMENTS

| | | | | |
|---|---|---|---|---|
| 5,381,417 A | * | 1/1995 | Loopik | G01R 31/2846 714/724 |
| 2016/0111384 A1 | * | 4/2016 | Tseng | H01L 24/11 257/737 |
| 2018/0158749 A1 | * | 6/2018 | Yu | H01L 24/94 |

* cited by examiner

*Primary Examiner* — Dale E Page
*Assistant Examiner* — Wilner Jean Baptiste
(74) *Attorney, Agent, or Firm* — Slater Matsil, LLP

(57) ABSTRACT

A method of forming a semiconductor package includes attaching a first package component to a first carrier; attaching a second package component to the first carrier, the second package component laterally displaced from the first package component; attaching a third package component to the first package component, the third package component being electrically connected to the first package component; removing the first carrier from the first package component and the second package component; after removing the first carrier, performing a first circuit probe test on the second package component to obtain first test data of the second package component; and comparing the first test data of the second package component with prior data of the second package component.

20 Claims, 14 Drawing Sheets

(51) Int. Cl.
  *H01L 23/00* (2006.01)
  *H01L 25/00* (2006.01)
  *H01L 25/10* (2006.01)
  *H01L 23/48* (2006.01)

(52) U.S. Cl.
  CPC ............... *H01L 2224/06505* (2013.01); *H01L 2224/117* (2013.01); *H01L 2224/13082* (2013.01); *H01L 2224/80006* (2013.01); *H01L 2224/80201* (2013.01); *H01L 2224/80379* (2013.01); *H01L 2224/80895* (2013.01); *H01L 2224/80896* (2013.01); *H01L 2224/80905* (2013.01); *H01L 2224/80948* (2013.01); *H01L 2224/95001* (2013.01); *H01L 2224/96* (2013.01)

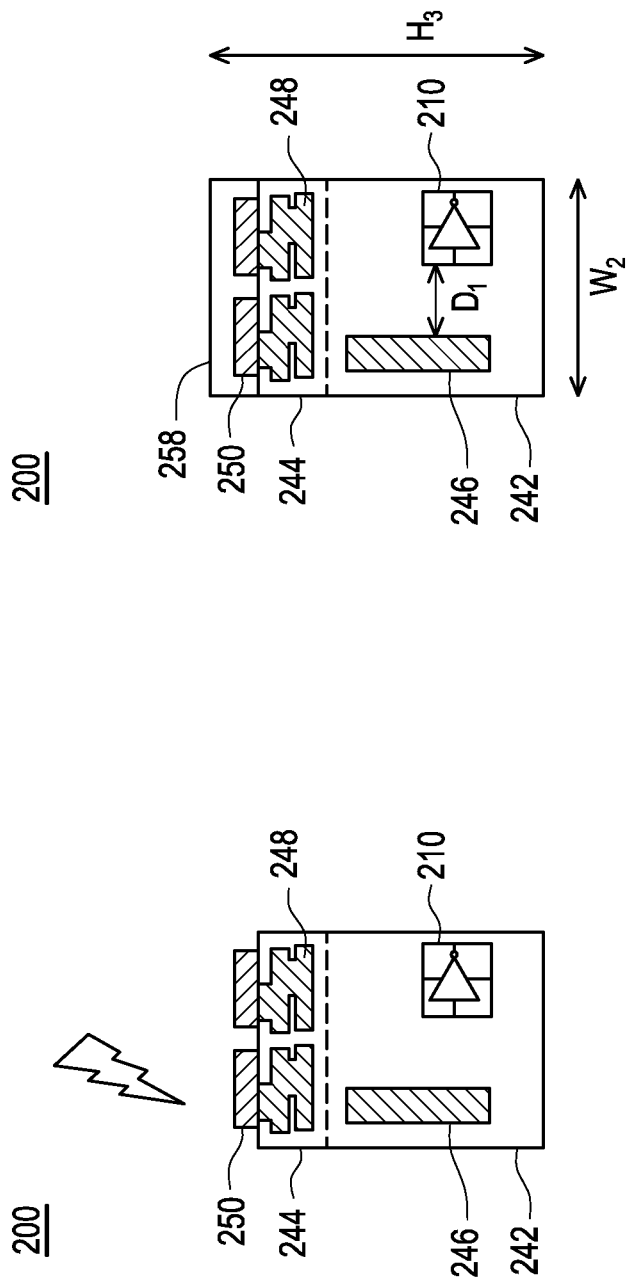

SEMICONDUCTOR PACKAGE AND METHOD OF FORMING SAME

PRIORITY CLAIM AND CROSS-REFERENCE

This application claims the benefit of the following provisionally filed U.S. Patent application: Application No. 63/230,103, filed on Aug. 6, 2021, and entitled "Innovative WAT Chip to Monitor SoIC Process Stress and Thermal Effect," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is System on an Integrated Circuit (SoIC) technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 2A, 2B, 3A, 3B, 4, 5, 6, 7, 8, 9, 10, 11A, 11B, 12A, and 12B illustrate various views of intermediate stages in the formation of a semiconductor package, in accordance with some embodiments.

DETAILED DESCRIPTION

Figure 1A:
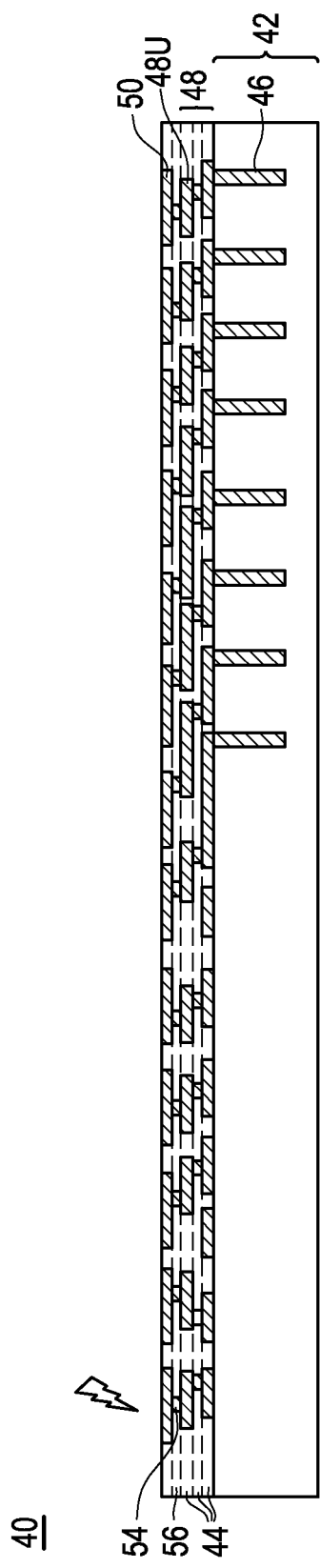

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and a method of forming the same are provided. In accordance with some embodiments of the present disclosure, a first package component is formed in a wafer and comprises an integrated circuit, through-substrate vias, and metal pads. The first package component may be singulated, flipped, and attached to a first carrier wafer. A monitoring chip may also be attached to the first carrier wafer directly adjacent to or near the first package component. The monitoring chip may similarly comprise an integrated circuit, one or more through-substrate vias, and metal pads. Subsequent processing steps, such as packaging of those components into a system on an integrated circuit (SoIC), may be performed to attach and connect one or more second package components to the one or more first package components. The subsequent processing imparts stresses and thermal effects on the first package component and the monitoring chip, which may change certain metrics of the first package component and the monitoring chip. Wafer acceptance testing (WAT) processes, or circuit probe (CP) testing, may be performed on the monitoring chip before attachment to the first carrier wafer and again after the subsequent processing steps. These WAT processes are designed to measure certain metrics of an integrated circuit that may be most vulnerable to changing due to the stresses and/or thermal effects from the subsequent processing. As such, comparing the changed metrics between the two WAT processes regarding the monitoring chip provides insight into how the first package component (and other components) may have been affected by those subsequent processing steps. Further processing/packaging steps may thus be adjusted based on those results. In some cases, further processing/packaging of components may be halted or abandoned entirely if the results of the WAT processes show that the metrics of the components changed by more than a desired amount. As a result, utilization of the monitoring chip and WAT processes can improve reliability and yield of the semiconductor package and reduce manufacturing costs. In addition, the information gained by the testing may lead to adjustments in further processing/packaging or in the processing/packaging of future semiconductor packages, thereby improving reliability of completed semiconductor packages during functional use.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1A, 1B, 2A, 2B, 3A, 3B, 4, 5, 6, 7, 8, 9, 10, 11A, 11B, 12A, and 12B illustrate various views of intermediate stages in the fabrication process of a semiconductor package, in accordance with some embodiments. The fabrication process includes wafer acceptance testing (WAT) and process control monitoring (PCM) processes as well as subsequent steps in the fabrication process to further increase efficiency and improve quality. FIGS. 1A, 1B, 2A, 2B, 3A, 4, 5, 6, 7, 8, 9, 10, 11A, 11B, 12A, and 12B are cross-sectional views and FIG. 3B is a top-down view.

Figure 1B:
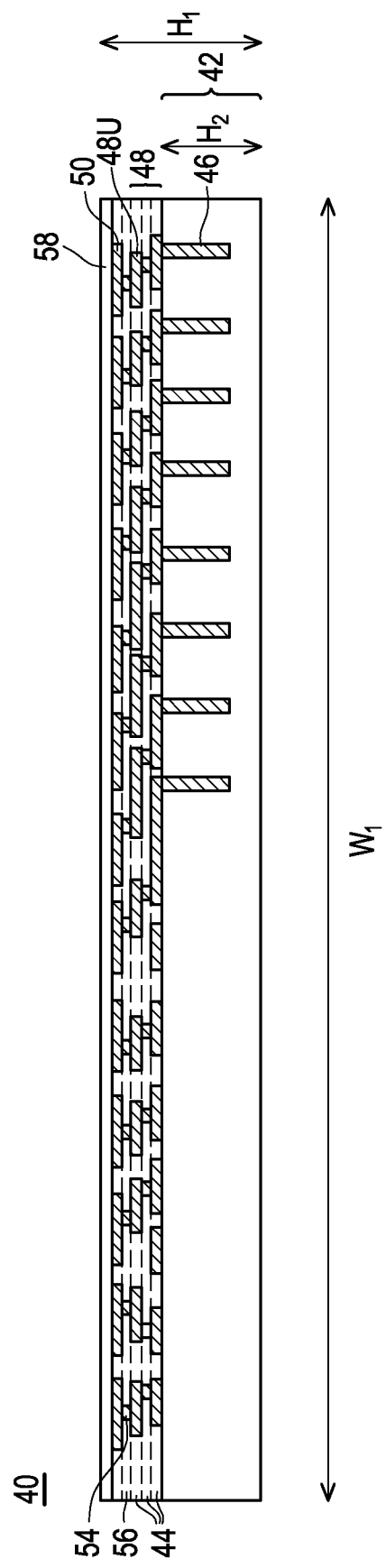

In FIGS. 1A and 1B, a first package component 40 is formed or provided, for example, in a wafer (not separately illustrated). In accordance with some embodiments, first package components 40 are individual device dies (e.g., integrated circuit dies), packages having one or more device dies packaged therein, System-on-Chip (SoC) dies including a plurality of integrated circuits integrated as a system, or the like. The device die(s) of first package components 40 may be or may comprise logic dies, memory dies, input-output dies, Integrated Passive Devices (IPDs), the like, or combinations thereof. For example, the logic device die(s) of first package components 40 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory die(s) of first package components 40 may include Static Random Access Memory (SRAM) dies, Dynamic Random Access Memory (DRAM) dies, or the like. The device die(s) of first package components 40 may include semiconductor substrates and interconnect structures.

In accordance with some embodiments, first package component 40 may include a semiconductor substrate 42 (e.g., a silicon substrate), integrated circuit devices (not separately illustrated) at a front-side surface of semiconductor substrate 42, a plurality of dielectric layers 44 formed over semiconductor substrate 42 and the integrated circuit devices, and an interconnect structure 48 formed through plurality of dielectric layers 44. The integrated circuit devices may include active devices (e.g., NMOS and PMOS transistors), passive devices, and the like. In addition, through-substrate vias (TSVs) 46 may extend partially through semiconductor substrate 42, and may further extend partially through plurality of dielectric layers 44.

As discussed above, interconnect structure 48 is disposed over the front-side of semiconductor substrate 42 and embedded in plurality of dielectric layers 44. Interconnect structure 48 includes metal lines and vias electrically connected to the integrated circuit devices. As illustrated, interconnect structure 48 includes a plurality of levels of the metal lines. In addition, one or more levels of upper metal lines 48U of interconnect structure 48 may be coupled to corresponding ones of TSVs 46, such as through levels of lower metal lines of interconnect structure 48.

Metal pads 50 are disposed over plurality of dielectric layers 44 and electrically connected to upper metal lines 48U of interconnect structure 48 by conductive vias 54 (e.g., embedded in a dielectric layer 56 disposed over plurality of dielectric layers 44). Metal pads 50 will help facilitate external electrical connection to the integrated circuit of first package components 40 during functional use and/or facilitate external electrical connection during, for example, wafer acceptance testing (e.g., circuit probe testing) of first package components 40. Metal pads 50 may comprise aluminum, an aluminum-copper alloy, or any suitable material. Although not separately illustrated, metal pads 50 may be coated with a dielectric layer for protection, such as from oxidizing an exposed surface. In some embodiments, the dielectric layer is an anti-reflective coating (ARC) and comprises an oxide or a nitride, such as silicon oxynitride (SiON), or any suitable material.

In some embodiments, metal pads 50 are formed by forming a sacrificial material (not shown) over dielectric layer 56. Openings are formed in the sacrificial material by first applying a photoresist over a top surface of the sacrificial material, which is patterned using a photolithographic mask. The patterned photoresist is then used as an etching mask to etch openings in the sacrificial material and dielectric layer 56 to expose conductive vias 54. To form the openings, the sacrificial material and dielectric layer 56 may be etched by a suitable process such as dry etching (e.g., reactive ion etching (RIE) or neutral beam etching (NBE), etc.), wet etching, or the like. In other embodiments, the sacrificial material itself is the photoresist, and an energy source (e.g., ultraviolet light) is shined through the photomask to change chemical properties (e.g., solubility) of regions of the sacrificial material impinged by the energy. To form the openings, those regions of the sacrificial material may be etched by a suitable process such as an isotropic wet etch process.

The openings within the sacrificial material and dielectric layer 56 are filled with a conductive material. In an embodiment, the conductive material may comprise a seed layer and a plate metal (not separately illustrated). The seed layer may be blanket deposited over the exposed top surfaces of conductive vias 54 and dielectric layer 56, and may comprise, for example, a copper layer. The seed layer may be deposited using processes such as sputtering, evaporation, or plasma-enhanced chemical vapor deposition (PECVD), or the like, depending upon the desired materials. The plate metal may be plated from the seed layer through a plating process such as electrical or electro-less plating. The plate metal may comprise aluminum, an aluminum-copper alloy, or the like. A removal process, such as a chemical mechanical polish (CMP) or a grinding process, may be performed to remove the photoresist, the sacrificial material, and portions of the conductive material outside of the openings through dielectric layer 56. The remaining portions of the conductive material (e.g., the seed layer and the plate metal) in the openings through dielectric layer 56 form metal pads 50.

Some of metal pads 50 may be connected to TSVs 46 by interconnect structure 48. Some of metal pads 50 may be connected to the integrated circuit devices at the surface of semiconductor substrate 42 by interconnect structure 48.

Referring to FIG. 1A, in some embodiments, a first wafer acceptance testing (WAT) process (e.g., circuit probe testing) may be performed on first package components 40 to ascertain whether first package components 40 are known good dies (KGDs). First package components 40 may be tested using one or more probes. The probes are physically and electrically coupled to certain ones of metal pads 50 by, e.g., reflowable test connectors. Only wafers with first package components 40 which are KGDs undergo subsequent processing and packaging (e.g., SoIC processing/packaging), and wafers with first package components 40 which fail the circuit probe testing are not subsequently processed and packaged. The testing may include providing power and ground voltages to metal pads 50 in order to test the functionality of the various first package components 40 (e.g., the integrated circuit devices and interconnect structure 48 within). In some embodiments, the circuit probe testing may include testing for known open or short circuits that may be expected based on the design of the integrated circuits within the first package components 40. In some embodiments, after testing is complete, the probes are removed and any excess reflowable material on metal pads 50 may be removed by, e.g., an etching process, a chemical-mechanical polish (CMP), a grinding process, or the like.

Referring to FIG. 1B, following the first WAT process, a dielectric bond layer 58 may be formed over metal pads 50 of first package component 40. Dielectric bond layer 58 may be a single homogenous layer or a composite of two or more layers comprising, for example, an oxide and/or a nitride, such as silicon oxide (SiO, such as $SiO_x$, wherein x is 2 or less), silicon oxynitride (SiON), silicon nitride (SiN), the like, or any suitable material(s). Dielectric bond layer 58 may be formed using spin coating, Flowable Chemical Vapor Deposition (FCVD), or the like. In accordance with some embodiments, after forming dielectric bond layer 58, individual first package components 40 are singulated from the wafer, using any suitable sawing process, in order for the KGDs of first package components 40 to undergo subsequent processing and packaging as discussed below.

First package component 40 may have a height $H_1$ ranging from 0.03 mm to 0.5 mm and a width $W_1$ ranging from 1 mm to 100 mm. In some embodiments, semiconductor substrate 42 may have a height $H_2$ ranging from 30 μm to 775 μm.

In FIGS. 2A and 2B, a monitoring chip 200 (e.g., a WAT monitoring chip) is formed or provided, for example, in the same wafer or in a different wafer (not separately illustrated) in which first package component 40 may have been formed. As discussed in greater detail below, monitoring chip 200 is a package component that will be attached to a carrier adjacent to one or more of first package components 40 to form a partial semiconductor package, and the partial semiconductor package will undergo subsequent processing to form a completed semiconductor package. The one or more of first package components 40 may experience extreme conditions, such as excessive stresses and/or thermal effects, during and due to the subsequent processing. Those conditions may affect the functionality, quality, and/or reliability of first package components 40. Monitoring chip 200, also being subjected to those conditions, may be tested to determine the degree to which those conditions may have affected monitoring chip 200. The insight from that test helps to determine whether first package components 40 that also underwent the subsequent processing may still be considered KDGs to eventually be used in an electrical device.

In accordance with some embodiments, monitoring chips 200 are individual device dies including an integrated circuit. The device dies of monitoring chips 200 may comprise logic dies comprising active and passive semiconductor devices. For example, similarly as first package component 40, monitoring chip 200 may include a semiconductor substrate 242 comprising active and/or passive integrated circuit devices 210 (illustrated with a circuit element symbol), a plurality of dielectric layers 244 formed over semiconductor substrate 242 and integrated circuit devices 210, an interconnect structure 248 formed through plurality of dielectric layers 244, and one or more through-substrate vias (TSVs) 246 extending at least partially through semiconductor substrate 242 (and optionally plurality of dielectric layers 244). In some embodiments (not separately illustrated), a back-side surface of monitoring chip 200 may include a dielectric layer disposed along semiconductor substrate 242. For example, the dielectric layer may comprise an oxide and/or a nitride, such as silicon oxide, silicon nitride, silicon oxynitride, or the like. In accordance with some embodiments, each of monitoring chips 200 may have smaller dimensions than and, therefore, occupy less space than each of first package components 40 over first carrier 20 (and in the semiconductor package).

In some embodiments, integrated circuit devices 210 include a plurality of transistors (e.g., NMOS and/or PMOS) and other devices. For example, integrated circuit devices 210 may include a ring oscillator, which is a device composed of an odd number of NOT gates having a circuit layout that forms a ring. When connected to an electrical source, the ring oscillator may provide an output that oscillates between two voltage levels. In addition, a margin of a ring oscillator is a metric that may be measured to determine information related to clocking and timing of the ring oscillator as well as functionality of transistors composing the ring oscillator.

Interconnect structure 248 of monitoring chip 200 includes metal lines and vias electrically connected to the integrated circuit devices 210. Interconnect structure 248 may include a plurality of levels of the metal lines, such as 10 or fewer levels of metal lines. In some embodiments, TSVs 246 may be electrically disconnected from integrated circuit devices 210 and interconnect structure 248. However, TSVs 246 may be formed in close proximity to integrated circuit devices 210, thereby having effects on the functionality of the integrated circuit (e.g., integrated circuit devices 210). Such phenomenon may be measurable if subsequent processing causes changes to the distance and/or orientation of TSVs 246 with respect to nearby integrated circuit devices 210. In other embodiments, interconnect structure 248 may be electrically connected with some of TSVs 246.

Monitoring chip 200 further includes metal pads 250, which may be aluminum pads similar to metal pads 50, disposed over plurality of dielectric layers 244 and electrically connected to interconnect structure 248. Metal pads 250 will help provide external electrical connection during circuit probe testing discussed below. Metal pads 250 may comprise aluminum, an aluminum-copper alloy, or any suitable material. Although not separately illustrated, metal pads 250 may be coated with a dielectric layer for protection, such as from oxidizing an exposed surface. In some embodiments, the dielectric layer is an anti-reflective coating (ARC) and comprises an oxide or a nitride, such as silicon oxynitride (SiON), or any suitable material.

In accordance with some embodiments, monitoring chips 200 are formed in a wafer and singulated into individual monitoring chips 200. In other embodiments, one or more monitoring chips 200 may be formed in the same wafer as first package components 40. In either case, monitoring chips 200 may be provided in pre-fabricated and pre-singulated form.

Referring to FIG. 2A, a second wafer acceptance testing (WAT) process, such as circuit probe testing, may be performed on monitoring chip 200. In some embodiments, the second WAT process is performed similarly as described above in connection with the first WAT process (see FIG. 1A). The second WAT process may acquire test data by measuring one or more metrics of monitoring chip 200. For example, the metrics may include margins of integrated circuit devices 210, such as a margin (e.g., an F-margin) of a ring oscillator. In addition, the metrics may include characteristics of transistors (e.g., NMOS transistors), such as a threshold voltage or leakage current of a transistor. This data may be compared to data measured during a subsequently performed third WAT process (see, e.g., FIGS. 10-12B), as discussed in greater detail below. In some embodiments, after testing is complete, the probes are removed and any excess reflowable material on metal pads 250 may be removed by, e.g., an etching process, a chemical-mechanical polish (CMP), a grinding process, or the like. In other embodiments, the second WAT process may have been performed previously (e.g., by a vendor of monitoring chips 200), and prior data of the metrics of the monitoring chips 200 may be known values which are provided with monitoring chips 200.

Referring to FIG. 2B, in some embodiments, following the second WAT process, a dielectric bond layer 258 may be formed over metal pads 50 of first package component 40. Dielectric bond layer 258, similarly as dielectric bond layer 58, may be a single homogenous layer or a composite of two or more layers comprising, for example, an oxide and/or a nitride, such as silicon oxide (SiO, such as SiO$_x$, wherein x is 2 or less), silicon oxynitride (SiON), silicon nitride (SiN), the like, or any suitable material(s). Dielectric bond layer 258 may be formed using spin coating, Flowable Chemical Vapor Deposition (FCVD), or the like. In accordance with some embodiments, after forming dielectric bond layer 258, individual monitoring chips 200 are singulated from the wafer, using any suitable sawing process to undergo subsequent processing and packaging as discussed below.

Monitoring chip 200 may have a height H$_3$ ranging from 10 µm to 30 µm and a width W$_2$ ranging from 1 mm to 10 mm. For example, monitoring chip 200 may have a footprint with a 4 mm$^2$ total area, such as having dimensions of 2×2 mm$^2$. Monitoring chip 200 may include 3 to 100 integrated circuit devices 210 (e.g., 3 to 100 transistors) and one to ten TSVs 246. For example, some embodiments of monitoring chip 200 may have three to ten transistors and include one, two, or three TSVs 246. In addition, some embodiments of monitoring chip 200 may have more than ten transistors and include three to 1000 TSVs 246. In accordance with some embodiments, some or all of TSVs 246 may each be a distance D$_1$ of less than or equal to 4 µm from a nearest one of integrated circuit devices 210, such as ranging from 1 µm to 4 µm away. Further, monitoring chip 200 may include four to 100 metal pads 250.

Figure 3A:
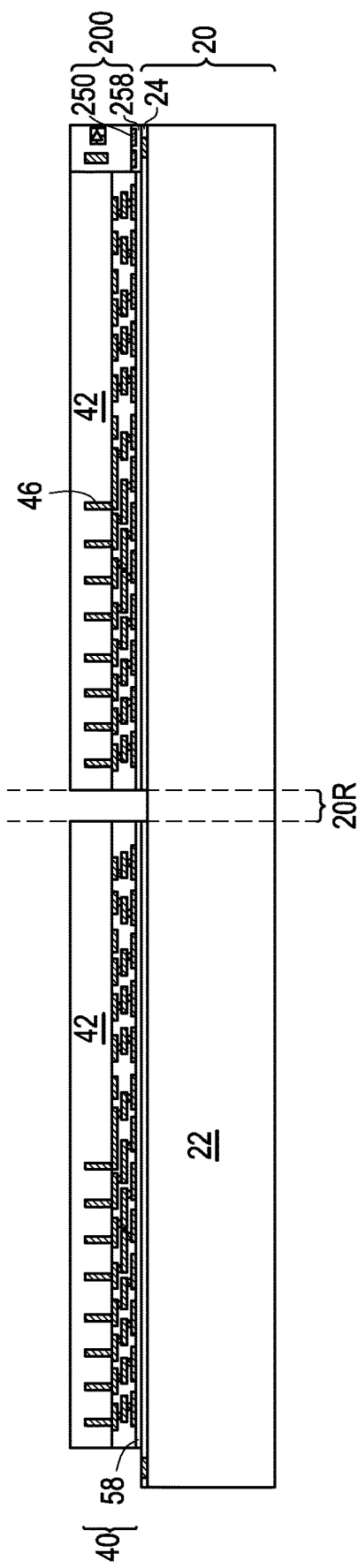
Figure 3B:
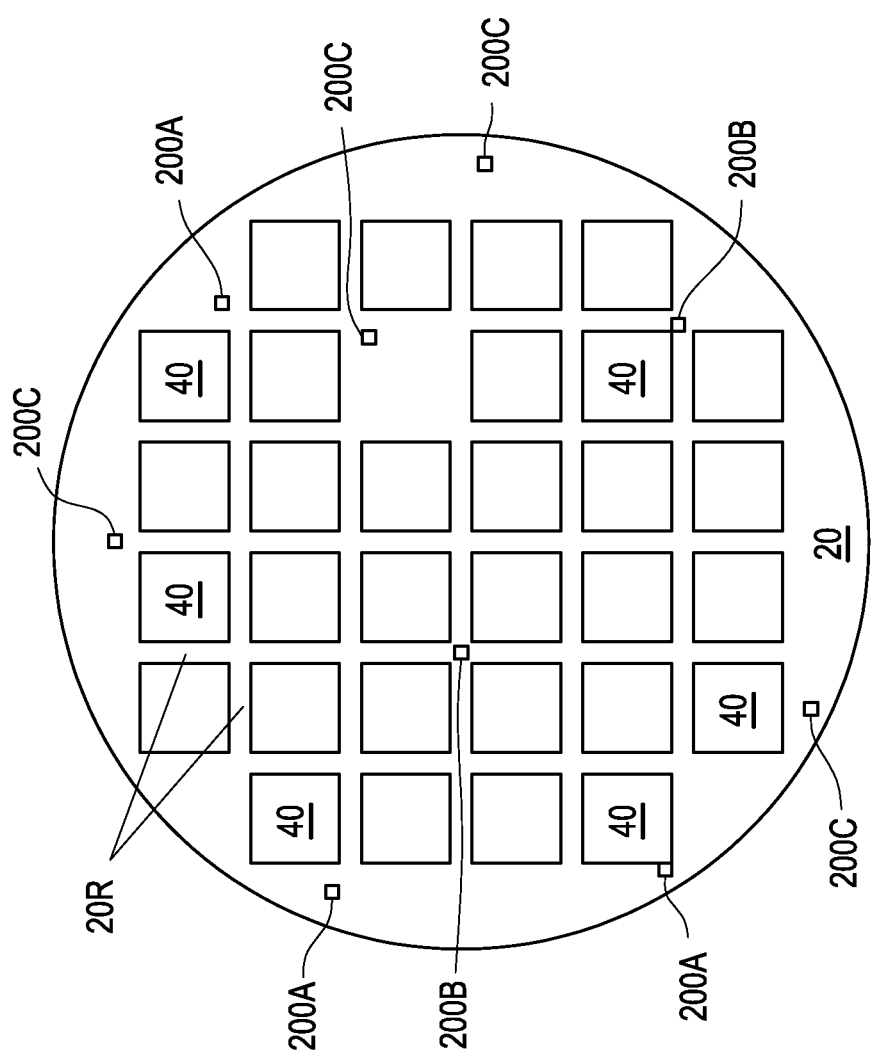

In FIGS. 3A and 3B, one or more of singulated first package components 40 and one or more of singulated monitoring chips 200 are bonded to a first carrier 20 through a direct bonding process, such as fusion bonding. As illustrated, the one or more of monitoring chips 200 may be attached laterally adjacent to (e.g., laterally displaced from) at least some of first package components 40. After attachment to first carrier 20, the combination of one or more of first package components 40 and one or more of monitoring chips 200 may be referred to herein as a partial semiconductor package. The partial semiconductor package will undergo subsequent processing (e.g., SoIC packaging), during which the one or more of first package component 40 and the one or more of monitoring chip 200 will experience similar conditions as one another. Although one first package component 40 and up to one monitoring chip 200 are illustrated in any particular region, there may be any number of first package components 40 (e.g., KGDs) and monitoring chips 200 bonded in a particular region of first carrier 20. In addition, regions of first carrier 20 may have varying numbers of each of first package components 40 and monitoring chips 200. The plurality of first package components 40 and monitoring chips 200 may be discrete package components physically separate from each other, and the bonding processes are die-to-wafer bonding.

First carrier 20 may be a substrate and includes a base carrier 22, one or more dielectric bond layers 24. In some embodiments, base carrier 22 may be a wafer and may be a similar material as semiconductor substrate 42 in first package component 40, so that in this and subsequent processing steps, warpage caused by mismatch of Coefficients of Thermal Expansion (CTE) is reduced. For example, base carrier 22 may be formed of or comprise silicon, while other materials such as laminate, ceramic, glass, silicate glass, or the like, may also be used. In accordance with some embodiments, the entire base carrier 22 is formed of a homogeneous material, with no other material different from the homogeneous material therein. In some embodiments, the entire base carrier 22 may be formed of silicon (doped or undoped), and without a metal region, dielectric region, etc., therein.

Before attaching first package components 40 and monitoring chips 200 to first carrier 20, dielectric bond layers 24 may be deposited on base carrier 22. Dielectric bond layers 24 may include oxide-based materials (e.g., silicon oxide based) such as silicon oxide (SiO, such as SiO$_x$, wherein x is 2 or less), phospho-silicate glass (PSG), borosilicate glass (BSG), boron-doped phospho silicate glass (BPSG), fluorine-doped silicate glass (FSG), or the like; nitride-based materials such as silicon nitride (SiN) or the like; oxynitride based materials such as silicon oxynitride (SiON) or the like; or other materials such as silicon oxycarbide (SiOC), silicon carbonitride (SiCN), or the like. Dielectric bond layers 24 may be formed using spin-coating, FCVD, Plasma Enhanced Chemical Vapor Deposition (PECVD), Low Pressure Chemical Vapor Deposition (LPCVD), Atomic Layer Deposition (ALD), the like, or combinations thereof. For example, in some embodiments, dielectric bond layers 24 may include a lowermost layer (e.g., proximal to base carrier 22) comprising an oxide, one or more middle layers comprising a nitride and/or an oxynitride, and an uppermost layer (e.g., distal from base carrier 22) comprising an oxynitride (e.g., with a lower nitrogen-to-oxygen ratio as compared with the middle layers). Although not separately illustrated, alignment marks may be formed in dielectric bonding layers 24 (e.g., the uppermost layer) using any suitable method.

In accordance with some embodiments, the bonding of first package components 40 to first carrier 20 includes pre-treating dielectric bond layers 24 and 58 with a process gas comprising oxygen (O$_2$) and/or nitrogen (N$_2$), performing a pre-bonding process to bond dielectric bond layers 24 and 58 together, and performing an annealing process following the pre-bonding process to strengthen the bond. In accordance with some embodiments, during the pre-bonding process, first package components 40 are put into contact with first carrier 20, with a pressing force applied to press first package components 40 against first carrier 20. The pre-bonding may be performed at room temperature (in a range from 20° C. to 25° C.), although a higher temperature may also be used.

After the pre-bonding, an annealing process is performed. Chemical bonds, such as Si—O—Si bonds, may be formed between dielectric bond layers 24 and 58, so that dielectric bond layers 24 and 58 are bonded to each other with high bonding strength. In accordance with some embodiments, the annealing process is performed at a temperature in a range from 200° C. to 350° C. The annealing duration may be in a range from 30 minutes to 60 minutes.

In some embodiments, the bonding of monitoring chips 200 to first carrier 20 may be performed simultaneously (e.g., in parallel) with the bonding of first package components 40 and/or may be performed similarly as described above. For example, first package components 40 may be placed over first carrier 20 and pre-bonded first, and monitoring chips 200 may be placed over first carrier 20 and pre-bonded next. The annealing process may then be performed to complete the bonding of first package components 40 and monitoring chips 200 to first carrier 20. In other embodiments, some or all of monitoring chips 200 may be placed and pre-bonded before first package components 40 are placed and pre-bonded.

For example, although not separately illustrated, dielectric bond layer 258 of monitoring chip 200 may be attached using a direct bonding process, such as fusion bonding, similar to attachment of first package components 40. However, monitoring chip 200 may be attached using an adhesive (not separately illustrated) or using any suitable method.

FIG. 3B illustrates an exemplary top-down view or layout for multiple embodiments in which first carrier 20 is a wafer on which a plurality of first package components 40 and one or more of monitoring chips 200 have been attached. FIG. 3B is intended to highlight locations for attaching each of representative monitoring chips 200A-C in relation to first package components 40 and/or to regions of first carrier 20.

As further illustrated, scribe line regions 20R provide additional context for the locations of representative monitoring chips 200A-C and first package components 40. However, in some embodiments not separately illustrated in FIG. 3B, more than one of first package components 40 and/or monitoring chips 200A-C may be grouped closely and bounded by scribe line regions 20R in order to be subsequently singulated into an individual semiconductor package comprising more than one of first package components 40 and/or more than one of monitoring chips 200.

For example, each representative monitoring chip 200A may be attached to first carrier 20 in a location proximal to a corner of at least one of first package components 40 and also proximal to an outer edge of first carrier 20. Monitoring chips 200A are disposed closer to the outer edge of first carrier 20 than monitoring chips 200B and monitoring chips 200C. In some embodiments, each representative monitoring chip 200A may be 80 μm or closer to the outer edge of first carrier and 50 μm or closer to a corner of a corresponding one of first package components 40. As such, during subsequent processing steps, monitoring chips 200A will experience conditions similar to a first package component 40 located near the outer edge of first carrier 20, which is a region of first carrier 20 that may experience greater stresses and/or thermal effects as compared to other regions of first carrier 20. Integrated circuit devices 210 (see FIGS. 2A and 2B) within representative monitoring chips 200A will also experience conditions similar to the integrated circuit devices within and near a corner of first package component 40. It should be noted that the integrated circuit devices within and near a corner of first package component 40 may be more susceptible to being affected by extreme conditions as compared to the integrated circuit devices located elsewhere within first package component 40.

In addition, each representative monitoring chip 200B may be attached to first carrier 20 in a location directly adjacent to a corner of one or more of first package components 40, which may be along or within scribe line regions 20R between adjacent first package components 40 that may be singulated later, such as near or after completion of the semiconductor package. Monitoring chips 200B are disposed closer to (e.g., directly adjacent to) a corner of one or more of first package components 40 than monitoring chips 200A and monitoring chips 200C. In some embodiments, each representative monitoring chip 200B may be 50 μm or closer to a corner of a corresponding one of first package components 40. In some embodiments, monitoring chips 200B may fit within scribe line regions 20R, which allows monitoring chips 200B to be located near corners of first package components 40 in multiple portions of first carrier 20 without reducing the total number of first package components 40 that may be attached to first carrier 20. In addition, representative monitoring chips 200B may be scattered throughout various portions of first carrier 20, such as near a central portion or near the outer edge of first carrier 20. As such, during the subsequent processing steps, integrated circuit devices 210 within monitoring chips 200B will experience conditions very similar to the integrated circuit devices within and near those adjacent corners of first package components 40, whether located in central regions or outer regions of first carrier 20.

Further, each representative monitoring chip 200C may be attached to first carrier 20 in various other locations that may be similar to, different from, or combinations of the types of locations described and illustrated with respect to representative monitoring chips 200A and representative monitoring chips 200B. As such, during the subsequent processing steps, representative monitoring chips 200C may experience similar or different conditions as those discussed above. In addition, in some embodiments, representative monitoring chips 200C may be placed in a location that would otherwise be occupied by one of first package components 40.

In accordance with some embodiments, a plurality of first package components 40 and one of monitoring chip 200 are attached to first carrier 20. As such, monitoring chip 200 may be placed in a location corresponding to either representative monitoring chips 200A or representative monitoring chips 200B. In other embodiments, monitoring chips 200 may be attached to first carrier in a lesser plurality than the plurality of first package components 40. In yet other embodiments, a same number of monitoring chips 200 as first package components 40 may be attached to first carrier 20 to ensure each of first package components 40 is represented by at least one of monitoring chips 200.

Figure 4:
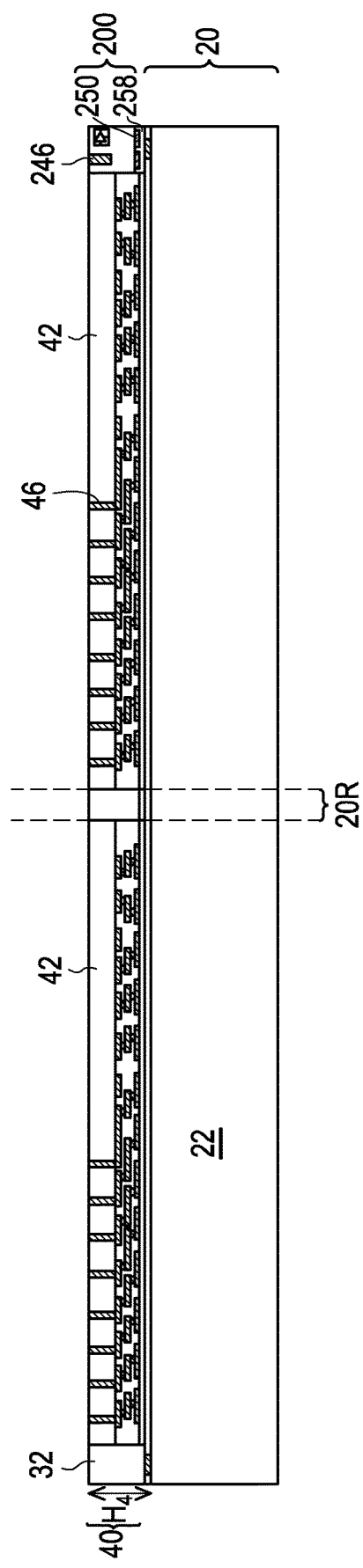

In FIG. 4, after attaching first package components 40 and monitoring chips 200 (hereinafter, this may include one or more of representative monitoring chips 200A, 200B, and/or 200C, see FIG. 3B) to first carrier 20, a gap-filling material 32 is formed over first package components 40, monitoring chip 200, and first carrier 20 to encapsulate first package components 40 and monitoring chip 200. Gap-filling material 32 may include a liner layer and a bulk layer (not separately illustrated). For example, the liner layer may be a conformal layer extending along the top surfaces and the sidewalls of first package components 40 and monitoring chip 200 and along top surfaces of dielectric bond layer 24. The liner layer may also be referred to as a seal-ring and, in some embodiments, is used as an etch stop layer in subsequent steps. The liner layer may be formed of a dielectric material that has good adhesion to the sidewalls of first package components 40, such as an extra low-k (ELK) material, including a nitride such as silicon nitride and/or an oxide such as silicon oxide. The deposition of the liner layer may include a conformal deposition process such as ALD, CVD, or any suitable process.

The bulk layer of gap-filling material 32 may be formed of a molding compound, an epoxy, a resin, and/or the like. For example, the bulk layer may comprise a nitride such as silicon nitride and/or an oxide such as silicon oxide and may be deposited using spin coating, FCVD, PECVD, LPCVD, ALD, or any suitable process.

A planarization process such as a CMP process and/or a mechanical grinding process is then performed to remove portions of gap-filling material 32 (e.g., the liner layer and the bulk layer) from over the back-side surfaces (the illustrated top surfaces) of first package components 40 and monitoring chip 200. In accordance with some embodiments, the planarization process is continued in order to thin portions of semiconductor substrate 42 until TSVs 46 are exposed. In some embodiments, TSVs 246 may be exposed by the planarization process. In other embodiments, TSVs 246 may remain non-exposed, or buried, within semiconductor substrate 242 of monitoring chip 200. After the planarization process, a back-side surface of each semiconductor substrate 42 may be coplanar (within process variations) with a top surface of gap-filling material 32. Following the planarization process, first package components 40 may have a similar height $H_4$ ranging from 20 μm to 200 μm. In embodiments in which monitoring chip 200 has a height $H_2$ sufficiently less than height $H_1$ of first package component 40, the planarization process may not reach the back-side surface (e.g., the dielectric layer along semiconductor substrate 242) of monitoring chip 200. As a result, following the planarization process, monitoring chip 200 may still have height H2 (see FIGS. 2A and B). Some of the gap-filling material 32 may remain on the back-side surfaces of those monitoring chip 200.

Figure 5:
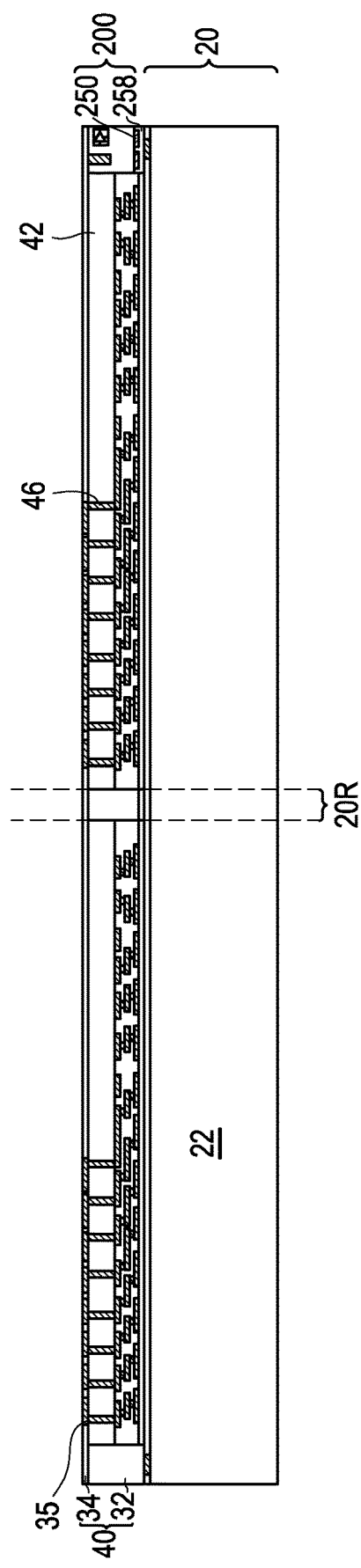

In FIG. 5, dielectric bond layer 34 and bond pads 35 are formed over the back-side surface of first package component 40 (e.g., the upper surface of semiconductor substrate 42 as illustrated). In some embodiments, dielectric bond layer 34 is first deposited over first package components 40, gap-filling material 32, and monitoring chip 200 using any suitable method such as ALD, CVD, or the like. Dielectric bond layer 34 may then be patterned to form openings, which are filled with a conductive material to form bond pads 35, similarly as described above in connection with metal pads 50. Bond pads 35 are formed over and electrically connected with TSVs 46 and, optionally, over and electrically connected with TSVs 246.

Figure 6:
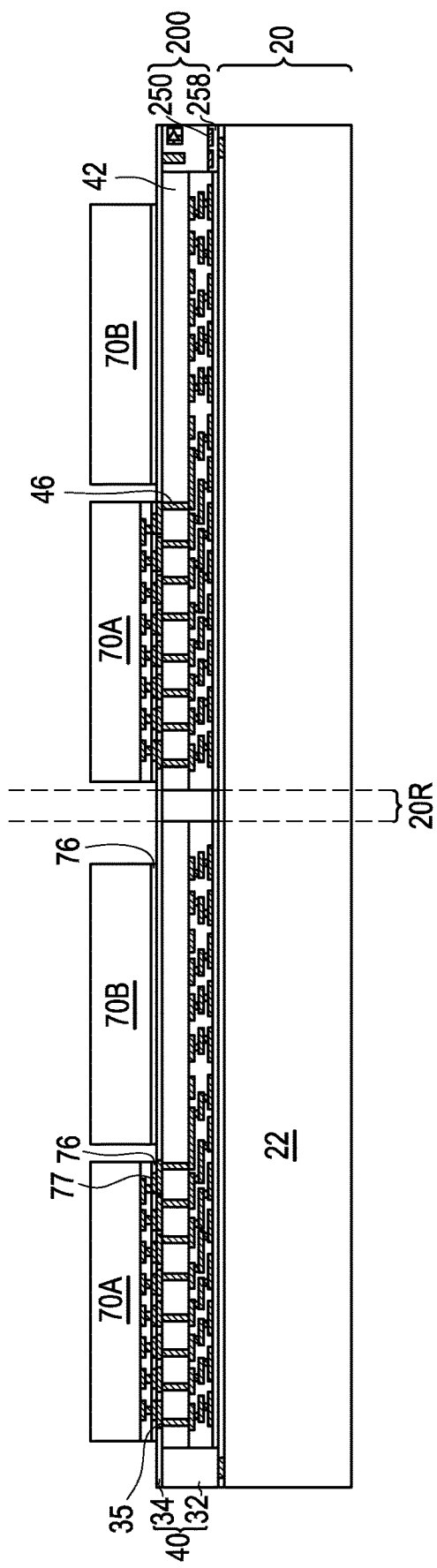

In FIG. 6, second package components 70 are attached to first package components 40. Second package components 70 may include active package components 70A and dummy package components 70B. Active package components 70A may include integrated circuits. Dummy package components 70B may be included for purposes of structural integrity and/or heat dissipation during fabrication and/or during functional use of the completed semiconductor package. For example, active package components 70A may be attached through a hybrid bonding process, and dummy package components 70B may be attached through a direct bonding process, such as fusion bonding. Although one of active package components 70A and one of dummy package components 70B are illustrated as being attached to each corresponding one of first package components 40, there may be a plurality of active package components 70A and/or a plurality of dummy package components 70B attached to each corresponding one of first package components 40. The plurality of second package components 70A/B may be discrete package components physically separate from each other (e.g., already singulated from their respective wafers). In other embodiments, only one of second package components 70A/B or other combinations of second package components 70A/B may be attached to a corresponding one of first package components 40.

In accordance with some embodiments, active package components 70A may be the same as, similar to, or different from first package components 40. For example, active package components 70A may be individual device dies (e.g., integrated circuit dies), packages having one or more device dies packaged therein, System-on-Chip (SoC) dies including a plurality of integrated circuits (or device dies) integrated as a system, or the like. The device die(s) of active package components 70A may be or may comprise logic dies, memory dies, input-output dies, Integrated Passive Devices (IPDs), the like, or combinations thereof. For example, the logic device die(s) of active package components 70A may be Central Processing Unit (CPU) dies, Graphic Processing Unit (GPU) dies, mobile application dies, Micro Control Unit (MCU) dies, BaseBand (BB) dies, Application processor (AP) dies, or the like. The memory die(s) of active package components 70A may include Static Random Access Memory (SRAM) dies, Dynamic Random Access Memory (DRAM) dies, or the like. The device die(s) of active package components 70A may include semiconductor substrates and interconnect structures. In accordance with some embodiments, first package components 40 are SoC dies, and active package components 70A are memory dies, such as SRAM dies.

In accordance with some embodiments (not separately illustrated), active package components 70A may include features similar to those described above in first package components 40. For example, active package components 70A may include a semiconductor substrate, integrated circuit devices (not separately illustrated), and a plurality of dielectric layers formed over the semiconductor substrate and the integrated circuit devices. The integrated circuit devices may include active devices, passive devices, and the like. Active package components 70A may further include dielectric bond layer 76 with bond pads 77 embedded within. Dummy package components 70B may also include dielectric bond layer 76.

In accordance with some embodiments, dummy package components 70B do not include functional integrated circuits and/or are electrically disconnected from first package components 40, second active components 70A, and monitoring chip 200. As discussed above, active package components 70A may provide structural support for the semiconductor package as well as heat dissipation from first package components 40 and/or active package components 70A during functional use of the semiconductor package.

The bonding of active package components 70A to first package components 40 may be achieved through hybrid bonding, in which both of metal-to-metal direct bonding (between bond pads 35 and 77) and dielectric-to-dielectric bonding (such as Si—O—Si bonding between surface dielectric bond layers 34 and 76) are formed. Furthermore, there may be a single or a plurality of active package components 70A bonded to the same first package component 40. The plurality of active package components 70A bonded to the same first package component 40 may be identical to, or different from, each other.

In accordance with some embodiments, dielectric bond layer 76 is bonded to the dielectric bond layer 34 through dielectric-to-dielectric bonding, without using any adhesive material (e.g., die attach film). Similarly, bond pads 77 are bonded to bond pads 35 through metal-to-metal bonding, without using any eutectic material (e.g., solder). The bonding may include a pre-bonding and an annealing. During the pre-bonding, a small pressing force is applied to press active package components 70A against first package components 40. The pre-bonding is performed at a low temperature, such as room temperature, such as a temperature in the range from 20° C. to 25° C., and after the pre-bonding, the dielectric bond layer 76 and dielectric bond layer 34 are bonded to each other. The bonding strength is then improved in a subsequent annealing step, in which dielectric bond layer 76 and dielectric bond layer 34 are annealed at a high temperature, such as a temperature in the range from 200° C. to 350° C. After the annealing, bonds, such as fusion bonds, are formed bonding dielectric bond layer 76 with dielectric bond layer 34. For example, the bonds can be covalent bonds between the material of dielectric bond layer 76 and the material of dielectric bond layer 34. Bond pads 77 and bond pads 35 are connected to each other with a one-to-one correspondence. Bond pads 77 and bond pads 35 may be in physical contact after the pre-bonding, or may expand to be brought into physical contact during the annealing. Further, during the annealing, the material of bond pads 77 (e.g., copper) and the material of bond pads 35 (e.g., copper)

intermingles, so that metal-to-metal bonds are also formed. Hence, the resulting bonds between active package components 70A and first package components 40 are hybrid bonds that include both dielectric-to-dielectric bonds and metal-to-metal bonds.

The bonding of dummy package components 70B to first package components 40 may be performed before, after, or at various points during attachment of active package components 70A. The bonding of dummy package components 70B is achieved through direct bonding, in which dielectric-to-dielectric bonding (such as Si—O—Si bonding between surface dielectric bond layers 34 and 76) is formed. Furthermore, there may be a single or a plurality of dummy package components 70B bonded to the same first package component 40. The plurality of dummy package components 70B bonded to the same first package component 40 may be identical to, or different from, each other.

Figure 7:
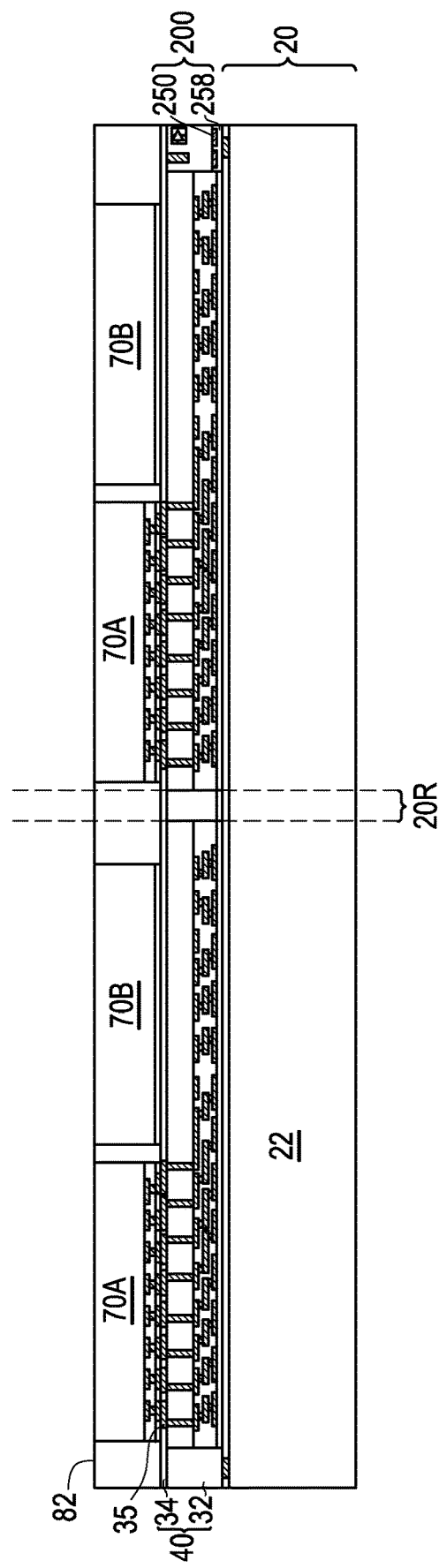

In FIG. 7, after attaching second package components 70 to first package components 40, a gap-filling material 82 is formed over and between second package components 70 to encapsulate second package components 70. Gap-filling material 82 may be formed similarly as described above in connection with gap-filling material 32. For example, gap-filling material 82 may include a liner layer and a bulk layer (not separately illustrated). The liner layer may be a conformal layer extending along the top surfaces and the sidewalls of second package components 70 as well as along exposed top surfaces of dielectric bond layer 34. The liner layer may also be referred to as a seal-ring and be formed of a dielectric material that has good adhesion to the sidewalls of second package components 70, such as an extra low-k (ELK) material, including a nitride such as silicon nitride and/or an oxide such as silicon oxide. The deposition of the liner layer may include a conformal deposition process such as ALD, CVD, or any suitable process.

The bulk layer of gap-filling material 82 may be formed of a molding compound, an epoxy, a resin, and/or the like. For example, the bulk layer may comprise a nitride such as silicon nitride and/or an oxide such as silicon oxide. For example, liner layer and gap-filling material 82 may be formed similarly as described above in connection with liner layer 30 and gap-filling material 32, respectively.

A planarization process such as a CMP process and/or a mechanical grinding process is then performed to remove portions of gap-filling material 82 (e.g., the liner layer and the bulk layer) from over the illustrated top surfaces of active package components 70A and/or dummy package components 70B. For example, a thinning process may be utilized, such as a CMP process, a grinding process, an etch back process, the like, or combinations thereof.

Figure 8:
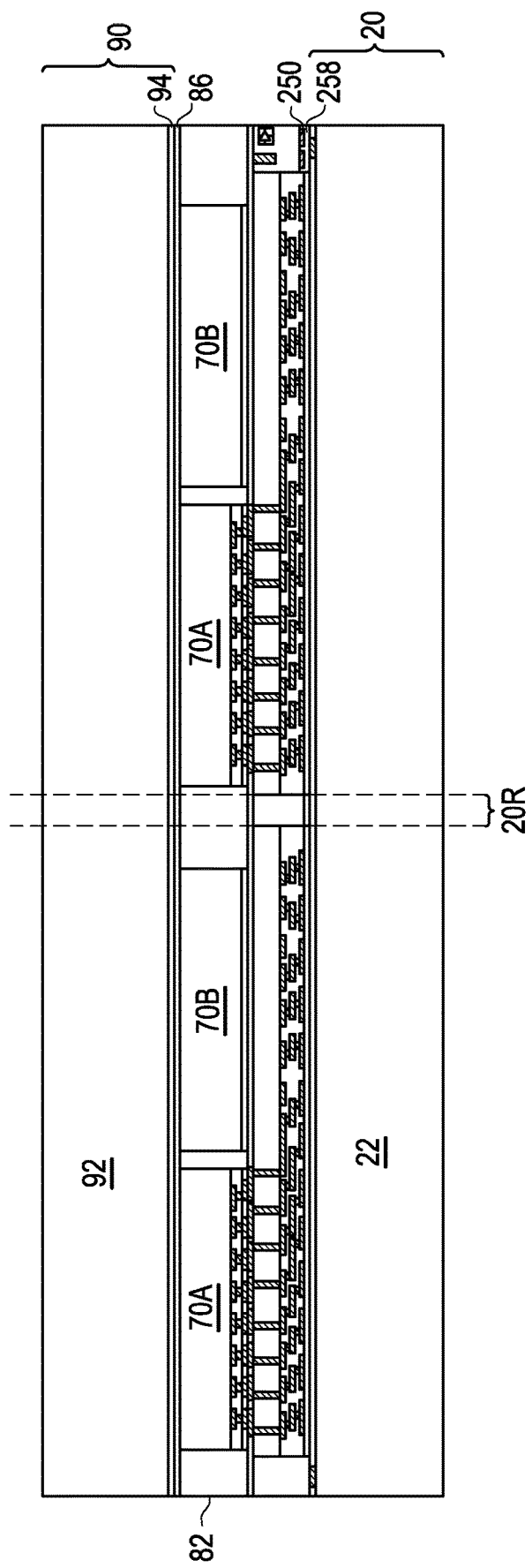

In FIG. 8, a second carrier 90 is bonded to second package components 70 through a direct bonding process, such as fusion bonding. Second carrier 90 may be a substrate and includes a base carrier 92 and one or more dielectric bond layers 94. Base carrier 92 may be a wafer, and may be formed of a same material as, for example, base carrier 22 in first carrier 20, so that in the subsequent packaging process, the warpage caused by mismatch of Coefficients of Thermal Expansion (CTE) is reduced. In accordance with some embodiments, base carrier 92 may be formed of or comprise silicon, while other materials such as laminate, ceramic, glass, silicate glass, or the like, may also be used. In accordance with some embodiments, the entire base carrier 92 is formed of a homogeneous material, with no other material different from the homogeneous material therein. For example, the entire base carrier 92 may be formed of silicon (doped or undoped), and there is no metal region, dielectric region, etc., therein.

Before attaching second carrier 90 to second package components 70, one or more dielectric bond layers 94 are deposited on base carrier 92 and one or more dielectric bond layers 86 are deposited over second package components 70. Dielectric bond layers 86 and 94 may be formed similarly as described above in connection with any of dielectric bond layers 24/34/58/76.

In accordance with some embodiments, the bonding of second carrier 90 to second package components 70 includes pre-treating dielectric bond layers 86 and 94 in a process gas comprising oxygen ($O_2$) and/or nitrogen ($N_2$), performing a pre-bonding process to bond dielectric bond layers 86 and 94 together, and performing an annealing process following the pre-bonding process to strengthen the bond. In accordance with some embodiments, during the pre-bonding process, second carrier 90 is put into contact with dielectric bond layers 86, with a pressing force applied to press second carrier 90 against second package components 70. The pre-bonding may be performed at room temperature (in a range from 20° C. to 25° C.), although a higher temperature may also be used.

After the pre-bonding, an annealing process is performed. Chemical bonds, such as Si—O—Si bonds, may be formed between dielectric bond layers 86 and 94, so that dielectric bond layers 86 and 94 are bonded to each other with high bonding strength. In accordance with some embodiments, the annealing process is performed at a temperature in a range from 200° C. to 350° C. The annealing duration may be in a range from 30 minutes to 60 minutes.

Figure 9:
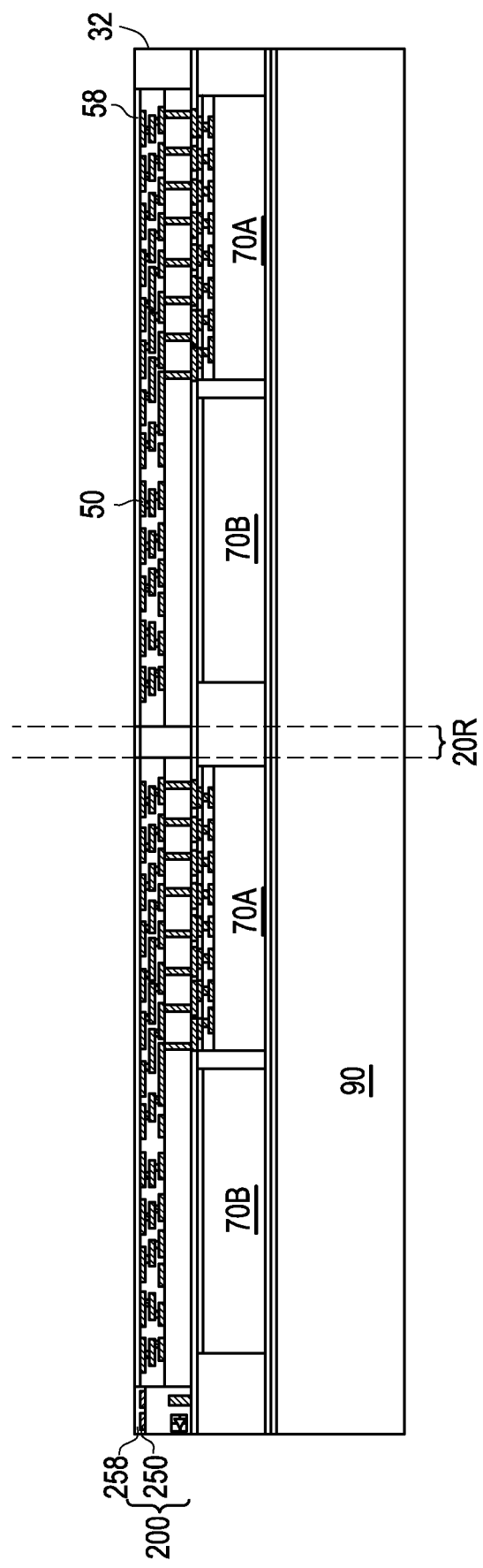

In FIG. 9, the structure may be flipped, and first carrier 20 is removed to expose dielectric bond layer 58 of first package components 40 and dielectric bond layer 258 of monitoring chip 200. First carrier 20 may be removed using any suitable method, such as a planarization process. The planarization process may continue until surfaces of dielectric bond layers 58 and 258 are coplanar (within process variations) with a surface of gap-filling material 32. The planarization process may be a CMP process, a grinding process, the like, or a combination thereof.

Figure 10:
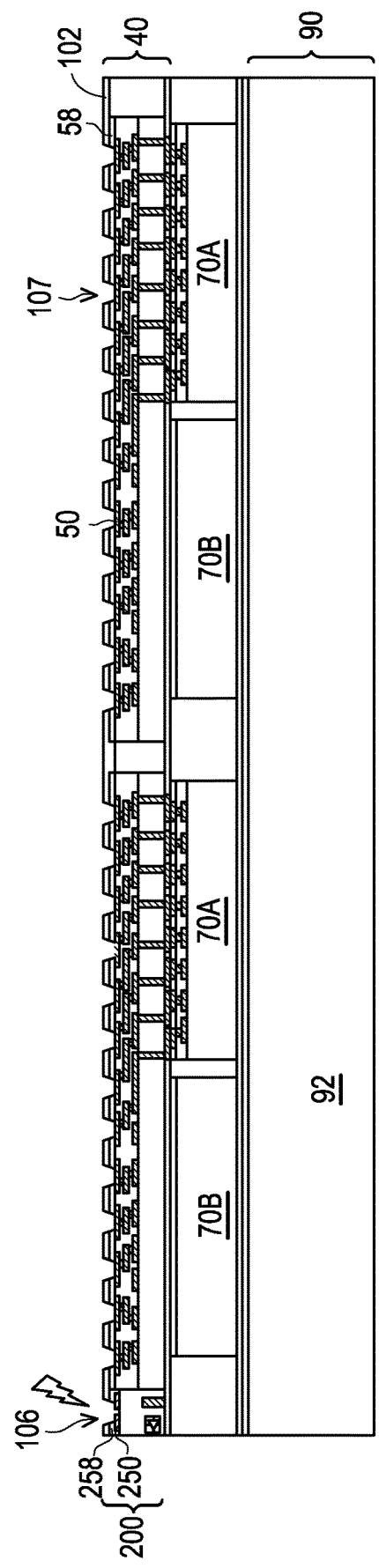

In FIG. 10, a passivation layer 102 may be formed over first package components 40 and monitoring chip 200, openings 106/107 are formed in passivation layer 102, and a third WAT process is performed on monitoring chip 200. In some embodiments, passivation layer 102 includes one or more dielectric layers formed over dielectric bond layer 58 and dielectric bond layer 258. Openings 106 are formed through passivation layer 102 and dielectric bond layer 258 to expose metal pads 250, and openings 107 are formed through passivation layer 102 and dielectric bond layer 58 to expose metal pads 50. The third WAT process may then be performed on metal pads 250 of monitoring chip 200 through openings 106.

Passivation layer 102 may be a single layer or a plurality of layers and be conformally deposited as an oxide such as silicon oxide, a nitride such as silicon nitride, silicon oxynitride, the like, or combinations thereof. For example, a silicon oxide lower layer (not separately illustrated) may be first deposited over the dielectric bond layer 58. A silicon nitride upper layer (also not separately illustrated) may then be deposited over the silicon oxide lower layer. The single or plurality of layers comprising passivation layer 102 may be deposited using any suitable methods, such as CVD, ALD, combinations thereof, or any suitable methods.

Passivation layer 102 may then be patterned to form openings 106/107 through passivation layer 102. Openings 106/107 may then be extended through dielectric bond layer 58 and dielectric bond layer 258. For example, a photoresist may be applied over a top surface of passivation layer 102 and patterned. The patterned photoresist is then used as an etching mask to etch portions of passivation layer 102 to expose dielectric bond layer 58 and dielectric bond layer 258. In some embodiments, the etching process stops at dielectric bond layer 58 so that metal pads 50 remain covered. In other embodiments, the etching process continues through dielectric bond layer 58 to expose metal pads 50. Passivation layer 102 may be etched by a suitable process such as dry etching (e.g., reactive ion etching (RIE), neutral beam etching (NBE), etc.), wet etching, or the like. In some embodiments, the etchants may be selected such that passivation layer 102 and/or dielectric bond layer 58 have high etch selectivities as compared with one another or with a dielectric coating layer (not separately illustrated) protecting metal pads 50. As such, dielectric bond layer 58 and/or the dielectric coating layer therefore serves as an etch stop layer during the etching process.

After forming openings 106, a third wafer acceptance testing (WAT) process, such as circuit probe testing at chip stacking level, may be performed on monitoring chip 200. In some embodiments, the third WAT process is performed similarly as described above in connection with the second WAT process (see FIG. 2A). The third WAT process is performed to ascertain test data of certain metrics to determine process stress and thermal effects that monitoring chip 200 (and first package components 40) may have experienced during the above-described processing steps, including the attachment of monitoring chip 200 and first package components 40 to first carrier 20 (see FIGS. 3A and 3B) through the removal of first carrier 20 (see FIG. 9) and formation of openings 106/107. The process stress and thermal effects may cause shifts in the performance metrics of, for example, transistors of first package components 40. As such, the third WAT process may measure the same performance metrics as measured in the second WAT process, such as the margins of ring oscillators, the threshold voltages of transistors, and leakage currents in the transistors. As discussed above, the stresses and heat during various processes may cause changes to TSVs 246, including size, orientation, position with respect to other features, or the like. For example, even if TSVs 246 are electrically disconnected from the integrated circuit of monitoring chip 200, any of those changes in one or more of TSVs 246 may affect the functionality of nearby ones of integrated circuit devices 210. As a result, those changes may affect values of some or all of the metrics of monitoring chip 200 measured during the third WAT process.

After performing the third WAT process on monitoring chip 200, the test data from the second and third WAT processes may be compared to identify changes in the performance metrics of monitoring chip 200 (e.g., from the second WAT process to the third WAT process). Those measured changes provide insight into whether those performance metrics may have also changed in first package components 40. Such insight is based on the fact that first package components 40 would have experienced similar processes/conditions as monitoring chip 200 between the second WAT process (e.g., attachment of first package components 70, see FIG. 6) and the third WAT process. As such, changes in metrics measured in monitoring chip 200 indicate degrees to which monitoring chip 200 and, similarly, first package components 40 may have experienced stresses and thermal conditions. In addition, the third WAT process may provide insight into stresses and thermal effects experienced by second package components 70 and/or other parts of the structure (e.g., near central regions or outer edges as described in connection with FIG. 3B). Such stressed and thermal conditions may have caused other changes in first package components 70 (and the rest of the semiconductor package) that may not necessarily be indicated during this or various other circuit probe testing.

Similarly as described above, during the third WAT process, monitoring chip 200 may be tested using one or more probes (not separately illustrated). The probes are physically and electrically coupled to metal pads 250 by, e.g., reflowable test connectors. The testing may include providing power and ground voltages to metal pads 250 in order to test the functionality of integrated circuit devices 210 within monitoring chip 200. In some embodiments, after testing is complete, the probes are removed and any excess reflowable material on metal pads 250 may be removed by, e.g., an etching process, a chemical-mechanical polish (CMP), a grinding process, or the like. The step of removing any excess reflowable material may be useful if another WAT process will be performed on monitoring chip 200 during a later stage of fabrication of the semiconductor package. If another WAT process will not be performed on monitoring chip 200, then this step may be skipped thereby allowing any excess reflowable material to remain on metal pads 250 of monitoring chip 200.

In accordance with some embodiments, results of the third WAT process may be compared to results of the second WAT process on monitoring chip 200. As discussed above and similarly as for the second WAT process, the third WAT process may measure metrics such as margins of the integrated circuit devices 210, including the margin (e.g., the F-margin) of a ring oscillator. In some embodiments, due to the above-described thermal effects, the F-margins measured in the third WAT process may shift by 4% to 17% as compared to the F-margins measured in the second WAT process. For example, the F-margin of a ring oscillator with 1.2V transistors may have decreased by about 4% from the F-margin of a ring oscillator with 1.2V transistors between the second and third WAT processes. In addition, the F-margin with 1.0V transistors may have decreased by about 8%, and the F-margin with 0.8V transistors may have decreased by about 17%.

Similarly as for the second WAT process, the third WAT process may also measure a threshold voltage of transistors (e.g., NMOS transistors) of the integrated circuit devices 210. In some embodiments, due to the above-described stress and thermal effects, the threshold voltage of an NMOS transistor measured in the third WAT process may have shifted (e.g., increased) by 5% to 30% as compared to the threshold voltage of an NMOS transistor measured in the second WAT process.

In addition, the second and third WAT processes may each measure the metric of the leakage current of a transistor among the integrated circuit devices 210. In some embodiments, due to the above-described stress and thermal effects, the leakage current of a transistor measured may have increased by about 10%.

A shift in any of the above-described metrics which is within the above-described ranges (or greater than the upper limits of the ranges) from the second WAT process to the third WAT process may indicate abandoning the fabrication of the structure (e.g., no further processing toward being provided to a customer or used in a functional electrical device). For example, such shifting in one or more of the metrics may indicate that monitoring chip 200, first package components 40, and active package components 70A experienced extreme conditions during the processing steps between the second and third WAT processes. Such extreme conditions may imply that, if completed, the semiconductor package may perform with low functionality or reliability (e.g., below functionality and reliability standards). In some embodiments, the shifts of the measured metrics may inform changes to subsequent processing to complete this semiconductor package. In addition, in some embodiments, the shifts of the measured metrics may inform changes in future fabrications to some of the above-described processes that may have caused the extreme conditions.

In some embodiments, determining whether to continue the series of subsequent processes to complete fabrication of this semiconductor package may depend on whether one or more of the metrics shifted from the second WAT process to the third WAT process by more than certain predetermined thresholds. For example, a difference between values of a first metric between the second and third WAT processes may be compared to a predetermined threshold value for that first metric. Further processing may be performed in response to the difference being less than the predetermined threshold, and further processing may be abandoned in response to the difference being greater than the predetermined threshold. Similar comparisons may be made with the other metrics. In some embodiments, fabrication of this semiconductor package may be abandoned if the F-margin of a ring oscillator with 1.2V transistors decreases by 5% or more, if the F-margin of a ring oscillator with 1.0V transistors decreases by 7% or more, and/or if the F-margin of a ring oscillator with 0.8V transistors decreases by 10% or more. In addition, fabrication of the semiconductor package may be abandoned if the threshold voltage of a transistor shifts by 10% or more. Further, fabrication of the semiconductor package may be abandoned if the leakage current of a transistor increases by 10% or more.

As discussed above, monitoring chip 200 may have smaller dimensions than first package component 40. A benefit of monitoring chip 200 having smaller dimensions than first package component 40 is that the integrated circuit devices 210 (see FIGS. 2A and 2B) within monitoring chip 200 are, in general, closer to sidewalls of monitoring chip 200 where the integrated circuit devices 210 may be more vulnerable to external conditions. By comparison, a smaller fraction of the integrated circuit devices within first package component 40 are similarly close to sidewalls of first package component 40, if any. In addition, various circuit probe testing performed on first package component 40 (e.g., discussed herein or otherwise) may not utilize all or any of those vulnerable integrated circuit devices of first package component 40. As a result, the third WAT process performed on monitoring chip 200 is particularly useful at assessing whether vulnerable portions of first package components 40 may have experienced extreme conditions. For example, some or all of first package components 40 may be deemed unsatisfactory for further processing if comparison of the second and third WAT processes shows that the partial semiconductor package experienced conditions considered to be too extreme. As a result, manufacturing yield may be improved avoiding such further processing. Alternatively, if comparison of the second and third WAT processes indicates that monitoring chip 200 did not experience extreme conditions, then it may be safely assumed that first package components 40 and second package components 70 also did not experience extreme conditions.

Still referring to FIG. 10, in accordance with other embodiments, openings 107 may be formed or finished after forming openings 106 and after performing the third WAT process. As a result, metal pads 50 remain covered and protected during the third WAT process. For example, passivation layer 102 may be patterned with the photoresist to form partial openings 107, similarly as described above with patterning passivation layer 102 to form openings 106. While the patterned photoresist remains over first package components 40, partial openings 107 may then be completed with a suitable etching process and etchant to remove portions of dielectric bond layer 58.

Figure 11A:
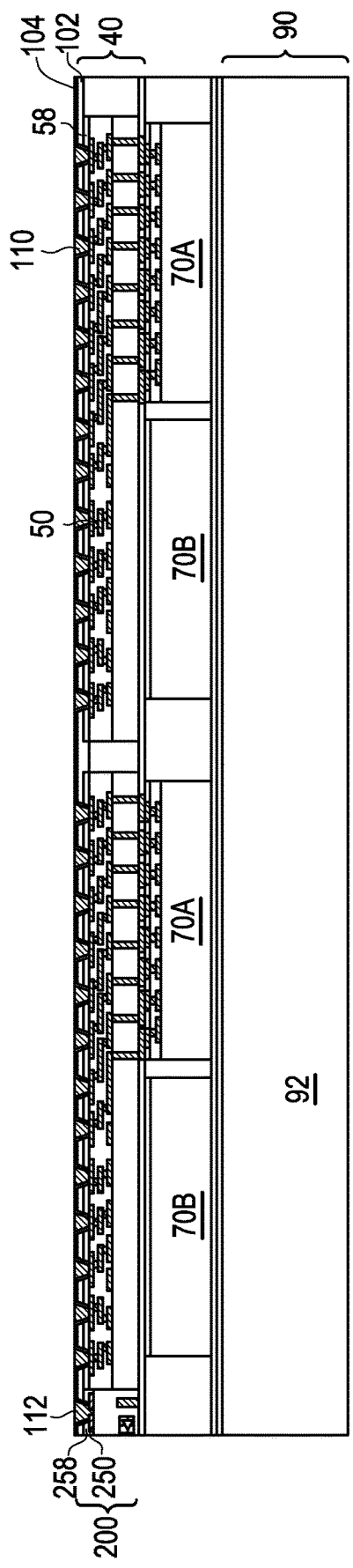
Figure 11B:
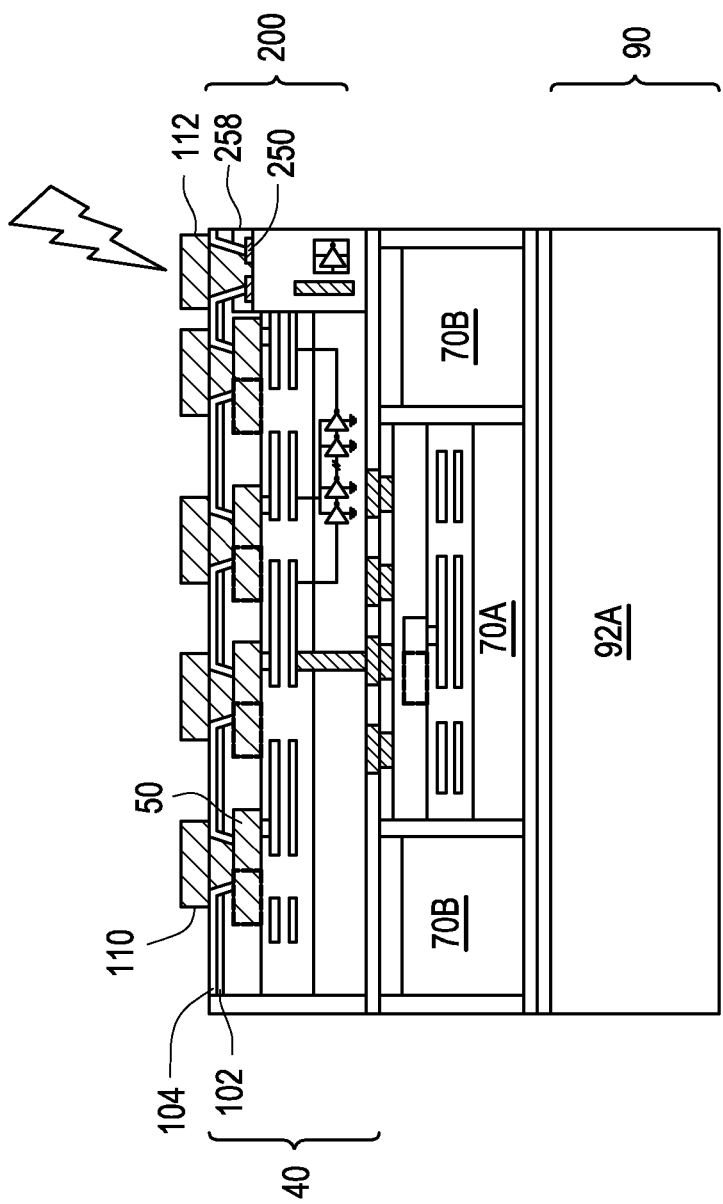

In FIGS. 11A and 11B, dielectric layer 104 may be formed over passivation layer 102 and patterned, under-bump metallurgies (UBMs) 110 are formed over dielectric layer 104 in openings 107, and, optionally, UBMs 112 are formed over dielectric layer 104 in openings 106. Dielectric layer 104 may be formed of a polymer material such as polyimide, silicon oxide (SiO, such as $SiO_2$, wherein x is 2 or less), the like, or any suitable material. Dielectric layer 104 may be conformally formed using, for example, spin coating, FCVD, PECVD, LPCVD, ALD, the like, or combinations thereof. As illustrated, dielectric layer 104 is formed over the top surface and along exposed sidewalls of passivation layer 102 as well as along exposed sidewalls of dielectric bond layer 58 within openings 106/107. As such, dielectric layer 104 partially fills and extends entirely across openings 106/107.

Dielectric layer 104 may then be patterned to re-form openings 107. For example, a photoresist may be applied over a top surface of dielectric layer 104 and patterned. The patterned photoresist is then used as an etching mask to etch dielectric layer 104 in order to re-form openings 107 and expose metal pads 50. Dielectric layer 104 may be etched by a suitable process such as dry etching (e.g., RIE or NBE, etc.), wet etching, or the like. Optionally, the patterning of dielectric layer 104 is also performed to re-form openings 106 over monitoring chip 200. However, if the third WAT process has already been performed on monitoring chip 200 and if additional WAT processes are not intended for monitoring chip 200, then re-forming openings 107 may not be performed.

UBMs 110 are formed in openings 106 to be electrically connected to metal pads 50. In embodiments in which dielectric layer 104 has been patterned to re-form openings 107 over monitoring chip 200, UBMs 112 may be formed in openings 107 similarly as and/or simultaneously with UBMs 110. As an example to form UBMs 110/112, a seed layer (not separately illustrated) is formed over the exposed surfaces of metal pads 50 and dielectric layer 104 (and metal pads 250). In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to UBMs 110/112. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form UBMs 110/112.

FIG. 11B illustrates another embodiment in which the third WAT process is performed after forming UBMs 110/112 instead of before forming UBMs 110/112 (see FIG. 10). It should be noted that first package component 40, second package components 70, and monitoring chip 200 are illustrated with a different configuration in FIG. 11B as compared with previous figures. FIG. 11B may be understood as illustrating a different cross-sectional view, such as perpendicular to the cross-sectional views of previous figures. As described and illustrated in FIG. 11B and in previous figures, first package components 40 are electrically connected with active package components 70A, while dummy package components 70B and monitoring chip 200 may remain electrically disconnected from other features of the structure (e.g., from first package components 40 and active package components 70A).

As illustrated, UBMs 112 are formed over and electrically connected with metal pads 250 of monitoring chip 200 to facilitate the third WAT process. A benefit of performing the third WAT process after forming UBMs 110/112 is that openings 106 may be formed simultaneously with openings 107, and UBMs 110 may be formed simultaneously with UBMs 112. As such, performing the third WAT process has a minimal impact on the yield (e.g., wafers per hour metrics) of fabricating the semiconductor package. In addition, UBMs 110 are formed soon after exposing metal pads 50 through openings 107, which ensures metal pads 50 are better protected, such as from unwanted oxidation.

Figure 12A:
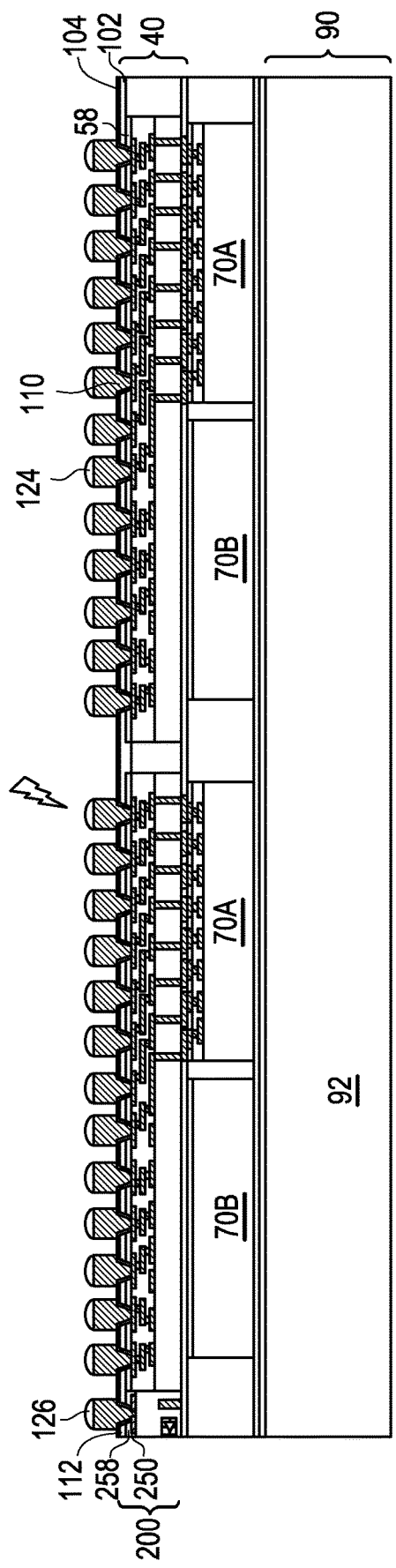
Figure 12B:
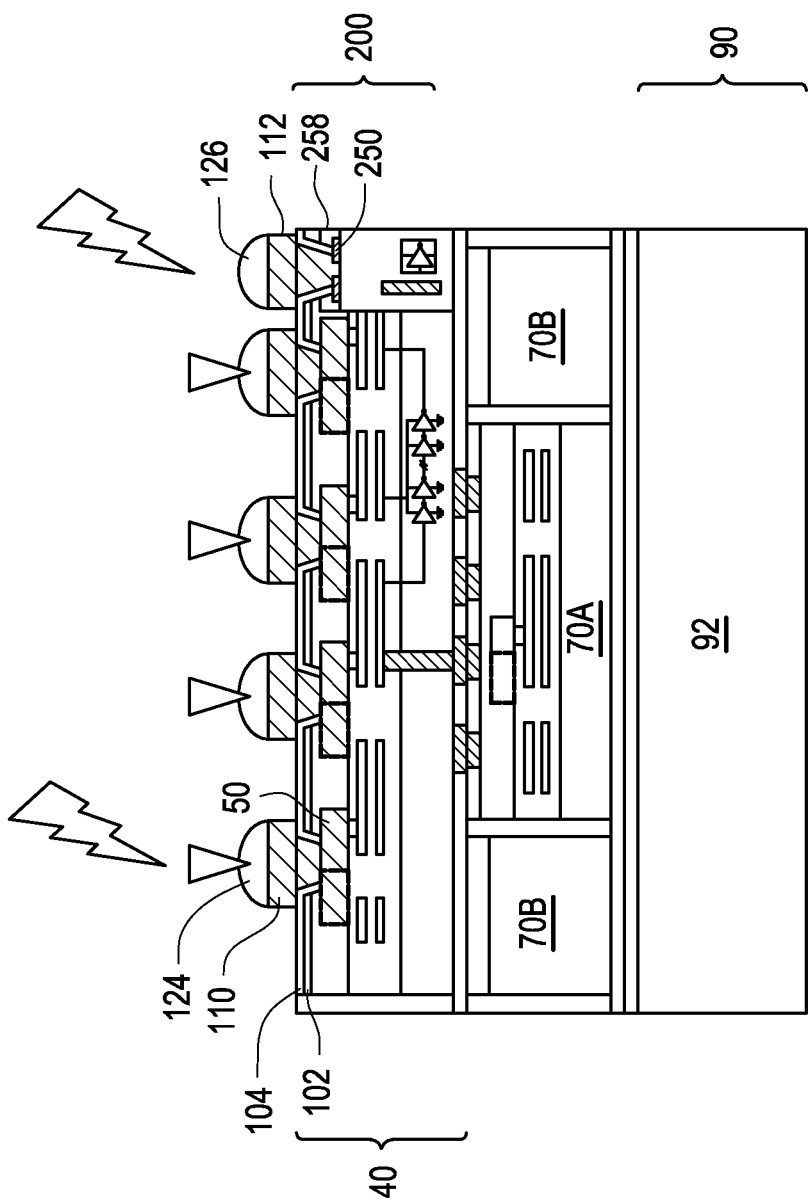

In FIGS. 12A and 12B, conductive connectors 124/126 are formed on UBMs 110/112, respectively. Conductive connectors 124 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. Conductive connectors 124 may include a conductive material such as solder, copper, aluminum, gold, nickel, silver, palladium, tin, the like, or a combination thereof. In some embodiments, conductive connectors 124 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, conductive connectors 124 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In accordance with some embodiments, conductive connectors 126 are formed over UBMs 112 and, therefore, electrically connected to monitoring chip 200. Conductive connectors 126 may be formed similarly as described above in connection with conductive connectors 124, including formed simultaneously with conductive connectors 124. In some embodiments, the third WAT process is performed on conductive connectors 126 instead of being performed on UBMs 112 (see FIG. 11B) or on metal pads 250 (see FIG. 10). In another embodiment, a fourth WAT process may be performed on conductive connectors 126 of monitoring chip 200 after the third WAT process. As such, a further comparison may be performed between the measured metrics from the fourth WAT process and the measured metrics from one or both of the second and third WAT processes.

After forming conductive connectors 124/126, a fifth wafer acceptance testing (WAT) process, such as circuit probe testing at chip stacking level, may be performed on the semiconductor package (e.g., on conductive connectors 124 disposed over first package components 40). The fifth WAT process provides a functional testing of the integrated circuits and electrical signal routing within and between first package components 40, active package components 70A, and any other functional package components attached thereto. The fifth WAT process determines which completed semiconductor packages may be delivered to customers with the associated quantitative data or otherwise used in electrical devices. Semiconductor packages that fail the fifth WAT process may not be subsequently delivered or otherwise used.

The fifth WAT process may include providing power and ground voltages to conductive connectors 124 to test the functionality of the integrated circuits, similarly as described above in connection with the other WAT processes, such as the first WAT process (see FIG. 1A). In some embodiments, the circuit probe testing of the fifth WAT process may further include testing for known open or short circuits that may be expected based on the design of the integrated circuits within the first package components 40 and/or the active package components 70A.

In accordance with some embodiments, the fifth WAT process provides an overall more extensive circuit probe test than any of the previous WAT processes, for example, including the first WAT process performed on first package component 40 (see FIG. 1A) and the second and third WAT processes performed on monitoring chip 200 (see FIGS. 2A, 10, 11B, and/or 12B). For example, the fifth WAT process may measure some or all of the metrics described above as well as several additional metrics. However, in some embodiments, the first and fifth WAT processes may measure first package component 40 for only some or none of the metrics measured in monitoring chip 200 during the second and third WAT processes. As a result, the comparison of data from the second and third WAT processes may provide additional metrics (e.g., analogous to monitoring chip 200) to those measured or determined by the fifth WAT process. In other words, measurements and comparisons from the second and third WAT processes may uniquely decouple or correlate process stress and thermal effects with the metrics measured in those WAT processes.

In accordance with some embodiments, the fifth WAT process is performed similarly as described above in connection with the first WAT process (see FIG. 1A). For example, the semiconductor package may be tested using one or more probes. The probes are physically and electrically coupled to conductive connectors 124 by, e.g., reflowable test connectors. In some embodiments, after testing is complete, the probes are removed and any excess reflowable material on conductive connectors 124 may be removed by, e.g., an etching process (e.g., wet etching), a chemical-mechanical polish (CMP), a grinding process, or the like.

Referring to FIG. 12B, in embodiments in which the third WAT process had not yet been performed as described in connection with FIGS. 9 and 11B, the third WAT process may be performed in conjunction with the fifth WAT process. In some embodiments, the third WAT process as described above may be performed just before the fifth WAT process. If the semiconductor package fails the third WAT process, the fifth WAT process may not be performed. The third and fifth WAT processes may be performed in any order, simultaneously, in parallel, or any other suitable way.

The disclosure is not intended to be limited to the specific embodiments described and discussed herein. For example, although embodiments describe monitoring chip 200 being attached to first carrier 20 shortly after or before attaching first package components 40, one or more monitoring chips 200 may be attached to the partial semiconductor package at later times in association with other process steps and/or at other locations of the partial/completed semiconductor package. For example, monitoring chips 200 may also or alternatively be attached over first package components 40 and laterally adjacent to (e.g., laterally displaced from) second package components 70. In some such embodiments, one or more monitoring chips 200 may be attached in place of one or more of dummy package components 70B. In some embodiments discussed here or above, after the semiconductor package has been deemed sufficient for further use, the semiconductor package may be further packaged into an electrical device.

Various advantages may be achieved. Preparation and use of monitoring chip 200 during fabrication of the semiconductor package can be used to provide insight into the conditions, such as stress and thermal effects, experienced by certain components incorporated into the partial semiconductor package at or around the same time as attachment of monitoring chip 200. For example, monitoring chip 200 may be formed as a comparatively small device die having 100 transistors (e.g., integrated circuit devices 210, see FIGS. 2A and 2B) or less and three TSVs 246 (see FIGS. 2A and 2B) or less. In some embodiments, monitoring chip 200 may have as few as ten transistors and one TSV 246. The integrated circuit (e.g., including integrated circuit devices 210) of monitoring chip 200 may be designed to allow wafer acceptance testing (WAT) processes (e.g., circuit probe testing) for certain metrics. For example, the metrics may include the margin of a ring oscillator, the threshold voltage of a transistor, and/or the leakage current of a transistor (or average values of those metrics for multiple devices).

By performing WAT processes at two different stages in the fabrication of a semiconductor package, the results can be compared to determine whether stress and thermal effects during the stages therebetween were sufficient (e.g., extreme) enough to safely assume the functionality and/or reliability of other integrated circuit devices within the semiconductor package (e.g., the integrated circuit devices within first package components 40) has been reduced. In such cases, completion of that semiconductor package may be abandoned (e.g., no further processing, except toward disposal and/or recycling) or subsequent processing/packaging steps may be adjusted to compensate for such issues. Alternatively, when comparison of the WAT processes shows that stress and thermal effects were sufficiently low, then it may be assumed first package components 40 are functional and reliable. By using such WAT chip, the stress and thermal effects may be monitored and controlled in real-time to reduce or prevent device shifts, leakages, and sheet resistance shifts.

In an embodiment, a method of forming a semiconductor package includes attaching a first package component to a first carrier; attaching a second package component to the first carrier, the second package component laterally displaced from the first package component; attaching a third package component to the first package component, the third package component being electrically connected to the first package component; removing the first carrier from the first package component and the second package component; after removing the first carrier, performing a first circuit probe test on the second package component to obtain first test data of the second package component; and comparing the first test data of the second package component with prior data of the second package component. In an embodiment, the method further includes, after comparing the first test data of the second package component with the prior data of the second package component, performing a second circuit probe test on the first package component to obtain second test data. In an embodiment, at least one metric of the second test data is additional to all metrics of the first test data. In an embodiment, the method further includes, after comparing the first test data of the second package component with the prior data of the second package component, determining that the semiconductor package will undergo further processing. In an embodiment, the method further includes, after comparing the first test data of the second package component with the prior data of the second package component, determining that the semiconductor package will not undergo further processing. In an embodiment, the second package component is electrically disconnected from the first package component and the third package component. In an embodiment, the attaching the first package component to the first carrier comprises attaching a first number of first package components to the first carrier, wherein the attaching the second package component to the first carrier comprises attaching a second number of second package components to the first carrier, and wherein the first number is greater than the second number. In an embodiment, the second package component is 50 µm or closer to a corner of the first package component.

In an embodiment, a method includes forming a partial semiconductor package by attaching a monitoring chip and a first device die to a carrier, the monitoring chip being electrically disconnected from the first device die; measuring a first value of a metric of the monitoring chip; performing a first series of processes on the partial semiconductor package; after performing the first series of processes, measuring a second value of the metric of the monitoring chip; performing a second series of processes on the partial semiconductor package when a difference between the second value of the metric and the first value of the metric is less than a predetermined threshold; and abandoning processing of the partial semiconductor package when the difference between the second value of the metric and the first value of the metric is greater than the predetermined threshold. In an embodiment, the metric is a margin of a ring oscillator, and wherein the difference between the second value of the metric and the first value of the metric is a shift in the margin of the ring oscillator. In an embodiment, the metric is a leakage current of a transistor, and wherein the difference between the second value of the metric and the first value of the metric is a shift in the leakage current of the transistor. In an embodiment, the metric is a threshold voltage of a transistor, wherein the difference between the second value of the metric and the first value of the metric is a shift in the threshold voltage of the transistor. In an embodiment, the first series of processes includes attaching a second device die to and electrically connected with the first device die by bonding a first bond pad of the first device die to a second bond pad of the second device die; and removing the carrier.

In an embodiment, a semiconductor package includes a first device comprising: first metal pads disposed along a first side of the first device die; a first interconnect structure disposed below and electrically connected to the first metal pads; a first semiconductor substrate disposed over the first interconnect structure, the first semiconductor substrate comprising first integrated circuit devices; and a first through-substrate via embedded in the first semiconductor substrate, the first through-substrate via electrically connected to the first integrated circuit devices; a monitoring chip disposed laterally adjacent to the first device die, the monitoring chip comprising: second metal pads disposed along a second side of the monitoring chip; a second interconnect structure disposed below and electrically connected to the second metal pads; a second semiconductor substrate disposed below the second interconnect structure, the second semiconductor substrate comprising second integrated circuit devices; and a second through-substrate via embedded in the second semiconductor substrate; and a first dielectric material disposed around sidewalls of the first device die and the monitoring chip; a second device die disposed below the first device die, the second device die being electrically connected to the first through-substrate via of the first device die, the monitoring chip being electrically disconnected from the first device die and the second device die; and a second dielectric layer disposed around sidewalls of the second device die. In an embodiment, the second integrated circuit devices form a ring oscillator. In an embodiment, the second through-substrate via is electrically disconnected from the second integrated circuit devices. In an embodiment, the second through-substrate via is less than or equal to 4 μm from the second integrated circuit devices. In an embodiment, a height of the monitoring chip is less than or equal to 30 μm. In an embodiment, the second integrated circuit devices comprise ten or fewer transistors. In an embodiment, the monitoring chip has a footprint of less than or equal to 4 mm$^2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package, the method comprising:
   attaching a first package component to a first carrier;
   attaching a second package component to the first carrier, the second package component laterally displaced from the first package component;
   attaching a third package component to the first package component, the third package component being electrically connected to the first package component;
   removing the first carrier from the first package component and the second package component;
   after removing the first carrier, performing a first circuit probe test on a metal pad of the second package component to obtain first test data of the second package component; and
   comparing the first test data of the second package component with prior data of the second package component.

2. The method of claim 1 further comprising, after comparing the first test data of the second package component with the prior data of the second package component, performing a second circuit probe test on the first package component to obtain second test data.

3. The method of claim 2, wherein at least one metric of the second test data is additional to all metrics of the first test data.

4. The method of claim 1 further comprising, after comparing the first test data of the second package component with the prior data of the second package component, determining that the semiconductor package will undergo further processing.

5. The method of claim 1 further comprising, after comparing the first test data of the second package component with the prior data of the second package component, determining that the semiconductor package will not undergo further processing.

6. The method of claim 1, wherein the second package component is electrically disconnected from the first package component and the third package component.

7. The method of claim 1, wherein the attaching the first package component to the first carrier comprises attaching a first number of first package components to the first carrier, wherein the attaching the second package component to the first carrier comprises attaching a second number of second package components to the first carrier, and wherein the first number is greater than the second number.

8. The method of claim 1, wherein the second package component is 50 μm or closer to a corner of the first package component.

9. A method comprising:
   forming a partial semiconductor package by attaching a monitoring chip and a first device die to a carrier, the monitoring chip being electrically disconnected from the first device die;
   measuring a first value of a metric of the monitoring chip;
   performing a first series of processes on the partial semiconductor package;
   after performing the first series of processes, measuring a second value of the metric of the monitoring chip;
   performing a second series of processes on the partial semiconductor package when a difference between the second value of the metric and the first value of the metric is less than a predetermined threshold; and
   abandoning processing of the partial semiconductor package when the difference between the second value of the metric and the first value of the metric is greater than the predetermined threshold.

10. The method of claim 9, wherein the metric is a margin of a ring oscillator, and wherein the difference between the second value of the metric and the first value of the metric is a shift in the margin of the ring oscillator.

11. The method of claim 9, wherein the metric is a leakage current of a transistor, and wherein the difference between the second value of the metric and the first value of the metric is a shift in the leakage current of the transistor.

12. The method of claim 9, wherein the metric is a threshold voltage of a transistor, wherein the difference between the second value of the metric and the first value of the metric is a shift in the threshold voltage of the transistor.

13. The method of claim 9, wherein the first series of processes comprises:
   attaching a second device die to and electrically connected with the first device die by bonding a first bond pad of the first device die to a second bond pad of the second device die; and removing the carrier.

14. A method comprising:
attaching a first device die to a first carrier, the first device die comprising:
   first metal pads along a first side of the first device die, the first side facing the first carrier;
   an interconnect structure disposed over and electrically connected to the first metal pads;
   a substrate disposed over the interconnect structure; and
   a first through-substrate via embedded in the substrate;
attaching a monitoring chip to the first carrier, the monitoring chip comprising second metal pads along a second side of the monitoring chip, the second side facing the first carrier;
thinning the substrate of the first device die to expose the first through-substrate via;
attaching a second device die to the first device die;
removing the first carrier and exposing the second metal pads of the monitoring chip;
performing a final circuit probe test on the monitoring chip;
forming conductive connectors onto and electrically connected to the first metal pads of the first device die; and
performing a stacking level circuit probe test on the first device die.

15. The method of claim 14, wherein after forming the conductive connectors:
the second device die is electrically connected to the first device die; and
the monitoring chip is electrically isolated from the first device die.

16. The method of claim 14, wherein a height of the monitoring chip is less than or equal to 30 µm.

17. The method of claim 14, wherein the monitoring chip comprises a footprint of less than or equal to 4 mm$^2$.

18. The method of claim 14, wherein the monitoring chip further comprises:
a MOS transistor; and
a second through-substrate via being electrically disconnected from the MOS transistor, the second through-substrate via being less than or equal to 4 µm from the MOS transistor.

19. The method of claim 14 further comprising:
before attaching the monitoring chip to the first carrier, performing an initial circuit probe test on the monitoring chip; and
before forming the conductive connectors, comparing results of the initial circuit probe test with results of the final circuit probe test.

20. The method of claim 14 further comprising:
forming a first gap-filling material around lateral sidewalls of the first device die and the monitoring chip; and
forming a second gap-filling material around lateral sidewalls of the second device die.

* * * * *